US007262492B2

(12) United States Patent
Pieda et al.

(10) Patent No.: US 7,262,492 B2
(45) Date of Patent: Aug. 28, 2007

(54) SEMICONDUCTING DEVICE THAT INCLUDES WIREBONDS

(75) Inventors: Ruel B. Pieda, Cavite (PH); Carmelito M. Libay, Cavite (PH); Joan Rey V. Buot, Cebu (PH)

(73) Assignee: Intel Corporation, Santa Clara, CA (US)

( * ) Notice: Subject to any disclaimer, the term of this patent is extended or adjusted under 35 U.S.C. 154(b) by 241 days.

(21) Appl. No.: 10/954,017

(22) Filed: Sep. 28, 2004

(65) Prior Publication Data

US 2006/0071312 A1 Apr. 6, 2006

(51) Int. Cl.
*H01L 23/02* (2006.01)

(52) U.S. Cl. ..................... 257/678; 257/676
(58) Field of Classification Search ............... 257/700, 257/666, 676, 701
See application file for complete search history.

(56) References Cited

U.S. PATENT DOCUMENTS

| 4,697,095 A | * | 9/1987 | Fujii | 327/408 |
| 5,625,235 A | * | 4/1997 | Takiar | 257/776 |
| 5,798,282 A | * | 8/1998 | Bertin et al. | 438/15 |

* cited by examiner

*Primary Examiner*—Roy Karl Potter
(74) *Attorney, Agent, or Firm*—Schwegman, Lundberg, Woessner & Kluth, P.A.

(57) ABSTRACT

Some embodiments relate to a semiconducting device that includes a substrate, a die and an interconnect device. The die and interconnect device are attached to an upper surface of the substrate. The semiconducting device further includes a first wire that is bonded to the substrate and to the interconnect device and a second wire that is bonded to the interconnect device and to the die. Other example embodiments include a stack of dice that has a bottom die attached to the upper surface of the substrate and a top die stacked onto the other dice in the stack of dice. The interconnect device is attached to an upper surface of any die in the stack of dice such that a first wire is bonded to the substrate and to the interconnect device and a second wire is bonded to the interconnect device and to the top die.

22 Claims, 9 Drawing Sheets

SEMICONDUCTING DEVICE THAT INCLUDES WIREBONDS

TECHNICAL FIELD

Some embodiments of the present invention relate to a semiconducting device, and in particular, to a semiconducting device that includes wire bonds.

BACKGROUND

High performance semiconducting devices are continually being redesigned in order to increase processing speed and/or power. Each increase in processing speed and power generally carries a cost of increased size such that additional innovations must be made in order to minimize the size of the semiconducting devices. Manufacturers of semiconducting devices continually try to improve product performance and reduce product size while minimizing production costs.

Several methods have been employed to improve the speed of semiconducting devices while minimizing the overall size of semiconducting devices. One method includes stacking multiple dice onto a substrate that electrically connects one or more of the stacked dice to other electronic components which make up part of an electronic system.

One drawback with stacking dice in this manner is that there are often problems associated with wire-bonding one or more of the stacked dice to the substrate. In some instances the wires may be inadvertently swept away from their intended location as the stack of dice is encapsulated. In addition, as the number of dice in a stack increases, the drawbacks that are associated with wire-bonding may be exacerbated because many of the wires need to be relatively long in order to reach some of the dice in the stack.

The drawbacks associated with wire-bonding may be present when even just one die is placed onto a substrate. As an example, the wires that are used to bond the substrate to the die may be problematically long depending on the design of the substrate and/or die.

DETAILED DESCRIPTION

Figure 1:
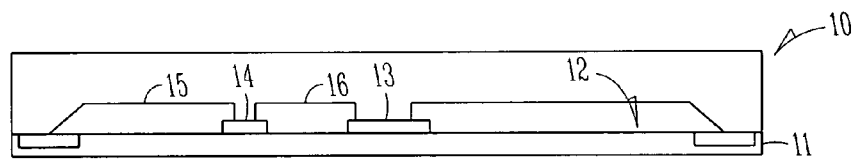
FIG. 1 is a side view illustrating an example embodiment of a semiconducting device that includes a die and an interconnect device attached to an upper surface of a substrate.

In the following detailed description, reference is made to the accompanying drawings. In the drawings, like numerals describe substantially similar components throughout the several views. Other embodiments may be utilized, and structural, logical, and electrical changes may be made.

Figure 2:
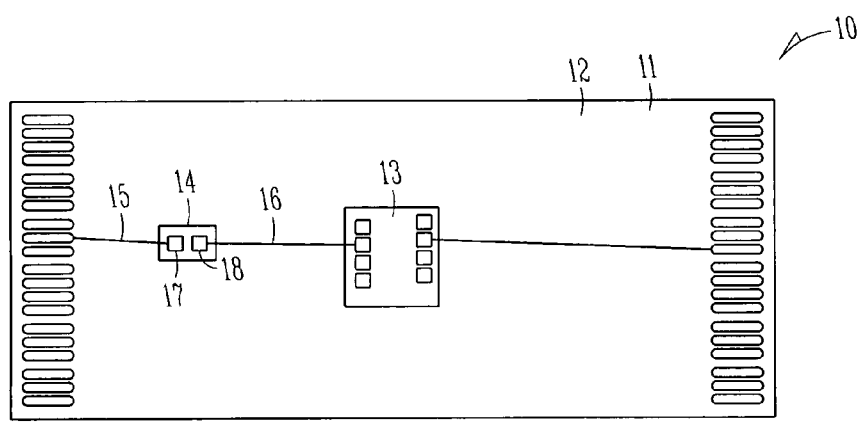
FIG. 2 is a top view of the semiconducting device shown in FIG. 1.

FIGS. 1 and 2 illustrate a semiconducting device 10 that includes a substrate 11 having an upper surface 12. A first die 13 is attached to the upper surface 12 of substrate 11 and an interconnect device 14 is attached to the upper surface 12 of substrate 11.

The first die 13 may be secured to the upper surface 12 of substrate 11 using an adhesive, conductive epoxy or some form of solder attachment (among other methods). In addition, first die 13 may be surface mounted to substrate 11 using a conventional C4 joint which may be supplemented by an underfill (e.g., an epoxy).

The interconnect device 14 may also be secured to the upper surface 12 of substrate 11 using an adhesive, conductive epoxy or some form of solder attachment (among other methods). In addition, interconnect device 14 may be surface mounted to substrate 11 using a conventional C4 joint which may be supplemented by an underfill (e.g., an epoxy).

The semiconducting device 10 further includes a first wire 15 that is bonded to substrate 11 and to interconnect device 14. A second wire 16 is bonded to interconnect device 14 and to first die 13.

A number of materials may be used for first die 13 and substrate 11. The choice of materials will depend on the relevant circuit design considerations and the costs that are associated with fabricating semiconducting device 10 (among other factors). Some example materials for first die 13 and/or substrate 11 include bismaleimide triazine, polyimide, fluropolymer, polyetherimide, polyester, polyethylene, polyethylene napathalate, polysulfone, polyvinylchloride, polyvinylflouride or some other dielectric material (among others).

Figure 3:
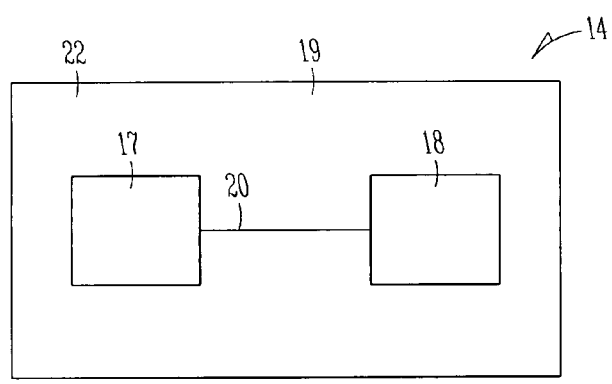
FIG. 3 is a top view illustrating an example interconnect device that may be used in the semiconducting device shown in FIGS. 1 and 2.
Figure 4:
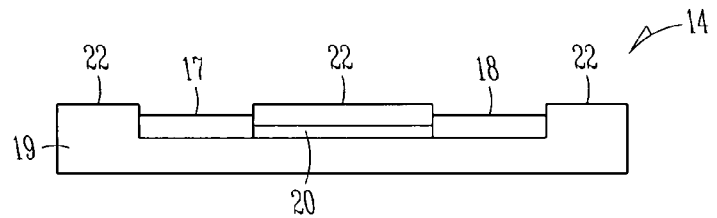
FIG. 4 is a side view illustrating another example interconnect device that may be used in the semiconducting device shown in FIGS. 1 and 2.

FIGS. 3 and 4 illustrate example interconnect devices 14 where a first pad 17 and a second pad 18 are formed on a silicon wafer 19. In some embodiments, first pad 17 and second pad 18 may be electrically connected by a trace 20 that is on the upper surface 22 of silicon wafer 19 (FIG. 3). In other embodiments, first pad 17 and second pad 18 may be electrically connected by a trace 20 that is below the upper surface 22 of silicon wafer 19 (FIG. 4).

First pad 17 serves as a first attachment point to connect interconnect device 14 to substrate 11 (or some other electronic component). In addition, second pad 18 serves as a second attachment point to connect interconnect device 14 to first die 13.

Although first and second pads 17, 18 are shown as square shaped, first and second pads 17, 18 may be any size and/or shape that facilitates bonding first and second wires to interconnect device 14. It should be noted that interconnect device 14 is not limited to embodiments shown in any of the FIGS.

As used herein, interconnect device includes any device that has at least two discrete wire attachment points such that a first wire may be bonded to one attachment point and a second wire may be bonded to another attachment point. The attachment points on the interconnect device are electrically connected through the interconnect device such that the first and second wires become electrically coupled once they are bonded to the attachment points.

Figure 5:
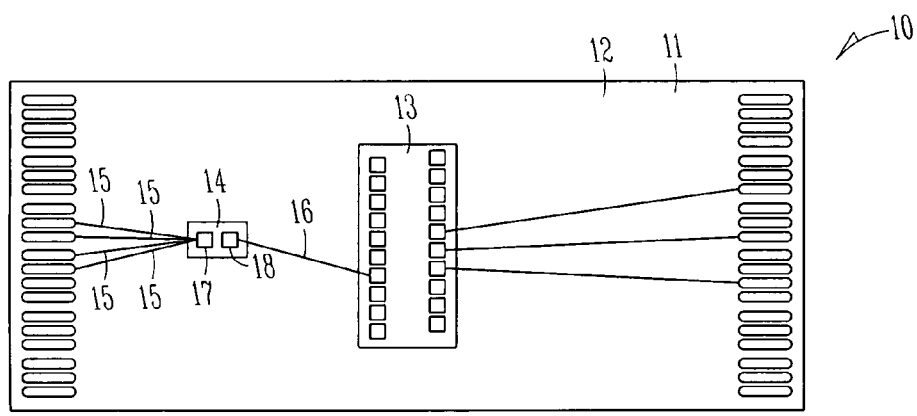
FIG. 5 is a top view illustrating another example embodiment of the semiconducting device.
Figure 6:
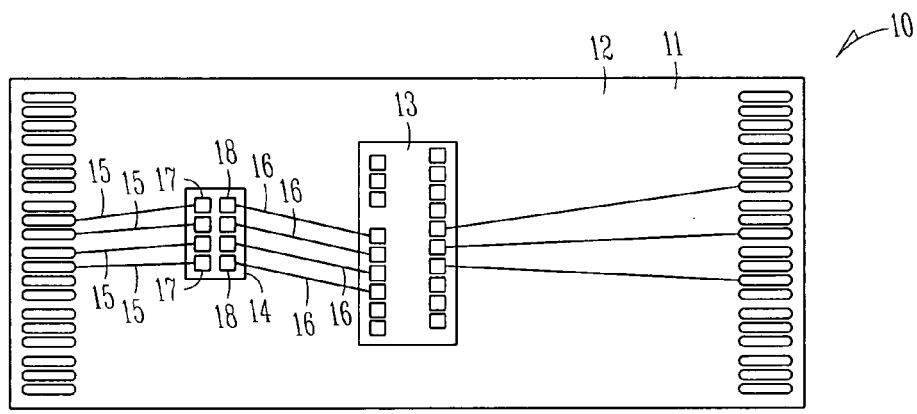
FIG. 6 is a top view illustrating yet another example embodiment of the semiconducting device.

FIG. 5 illustrates an example semiconducting device 10 that includes a plurality of wires 15, 16 where some of the wires 15 are bonded to the upper surface 12 of substrate 11 and to interconnect device 14 and others of the wires 16 are bonded to interconnect device 14 and to first die 13. As shown in FIG. 6, interconnect device 14 may include a plurality of pads 17, 18 such that each of the wires 15, 16 is bonded to one of the pads 17, 18. In the illustrated example embodiment, pad 17 may be directly connected to pad 18.

In the example embodiment illustrated in FIG. 6, each of the wires 15, 16 is bonded to a separate pad 17, 18, although the bonding arrangement of the wires 15, 16 and pads 17, 18 will depend on the application where the semiconducting device 10 is to be used. In some embodiments, the plurality of pads 17, 18 may include multiple pairs of pads that are electrically isolated from each other.

Figure 7:
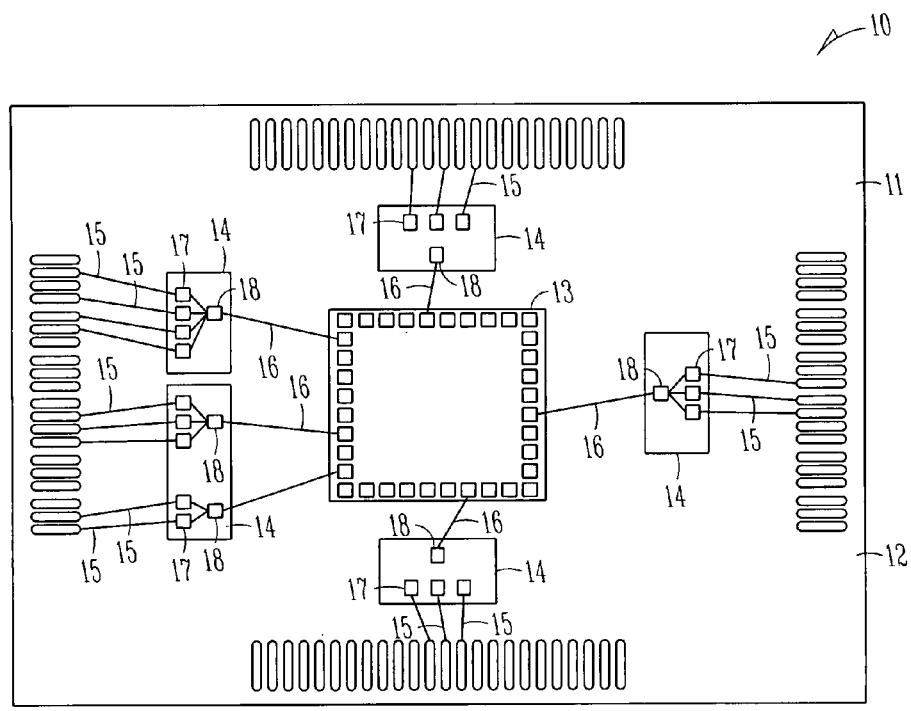
FIG. 7 is a top view illustrating still another example embodiment of the semiconducting device.

FIG. 7 shows an example embodiment of semiconducting device 10 that includes a plurality of interconnect devices 14. Each interconnect device 14 is bonded to at least one wire 15 that is also bonded to substrate 11. In addition, each interconnect device 14 is bonded to at least one other wire 16 that is also bonded to first die 13. In the example embodiment illustrated in FIG. 7, there are interconnect devices 14 attached to the upper surface 12 of substrate 11 on multiple sides of first die 13.

Figure 8:
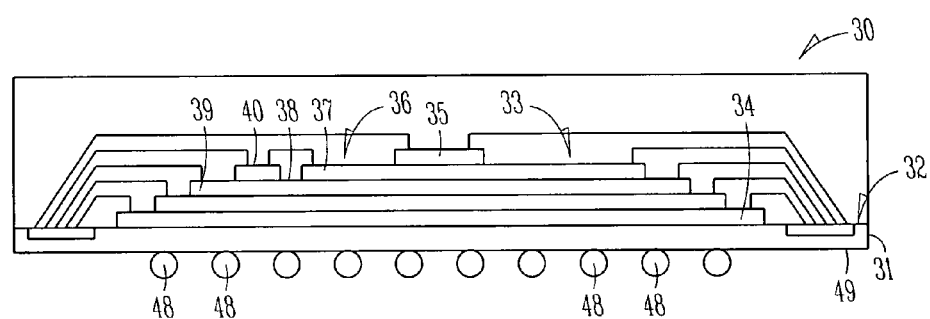
FIG. 8 is a side view illustrating an example embodiment of a semiconducting device that includes multiple dice stacked onto an upper surface of a substrate.
Figure 9:
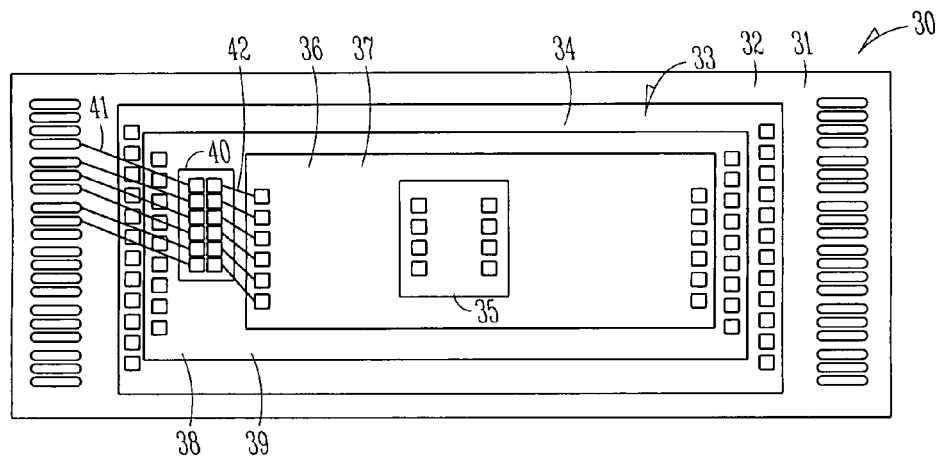
FIG. 9 is a top view of the semiconducting device shown in FIG. 8.

FIGS. 8 and 9 illustrate another example semiconducting device 30 that includes a substrate 31 having an upper surface 32. The semiconducting device 30 further includes a stack of dice 33. The stack of dice 33 includes a bottom die 34 that is attached to the upper surface 32 of substrate 31 and a top die 35 that is stacked onto the other dice in the stack of dice 33.

The semiconducting device 30 further includes an interconnect device 40 that is attached to an upper surface of any die in the stack of dice 33. A first wire 41 is bonded to the substrate 31 and to interconnect device 40, and a second wire 42 is bonded to interconnect device 40 and to top die 35. It should be noted that interconnect device 40 may be similar to any of the interconnect devices 14 which are shown in FIGS. 1–7.

Figure 10:
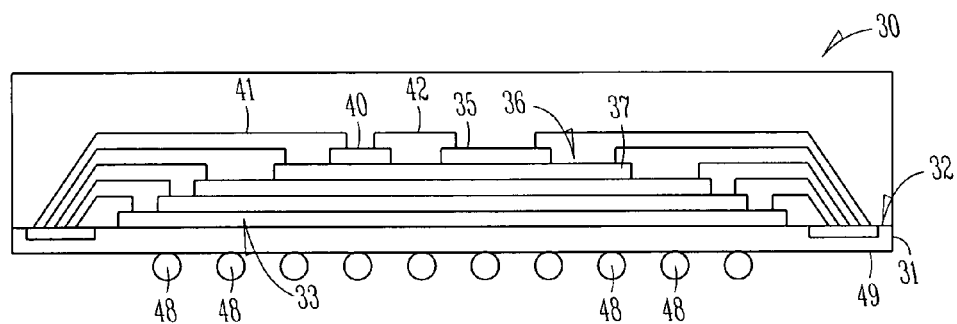
FIG. 10 is a side view illustrating another example embodiment of the semiconducting device.
Figure 11:
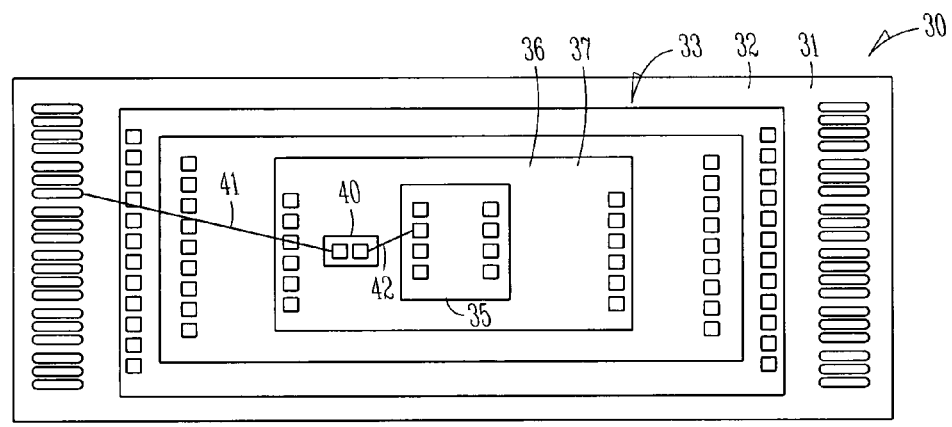
FIG. 11 is a top view of the semiconducting device.

In the example embodiment illustrated in FIGS. 8–9, top die 35 is attached to an upper surface 36 of one die 37 in the stack of dice 33 and interconnect device 40 is attached to an upper surface 38 of a different die 39 in the stack of dice 33. FIGS. 10–11 show another example embodiment of semiconducting device 30 where top die 35 and interconnect device 40 are attached to the upper surface 36 of the same die 37 in the stack of dice 33.

Figure 12:
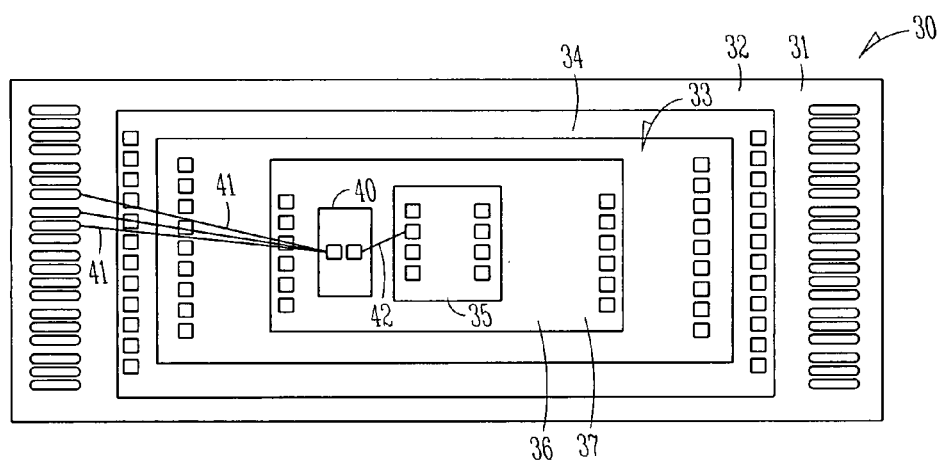
FIG. 12 is a top view illustrating another example embodiment of the semiconducting device.

As shown in FIG. 12, semiconducting device 30 may further include a plurality of wires 41, 42 where some of the wires 41 may be bonded to the upper surface 32 of substrate 31 and to interconnect device 40. In addition, others of the wires 42 may be bonded to interconnect device 40 and to top die 35.

Figure 13:
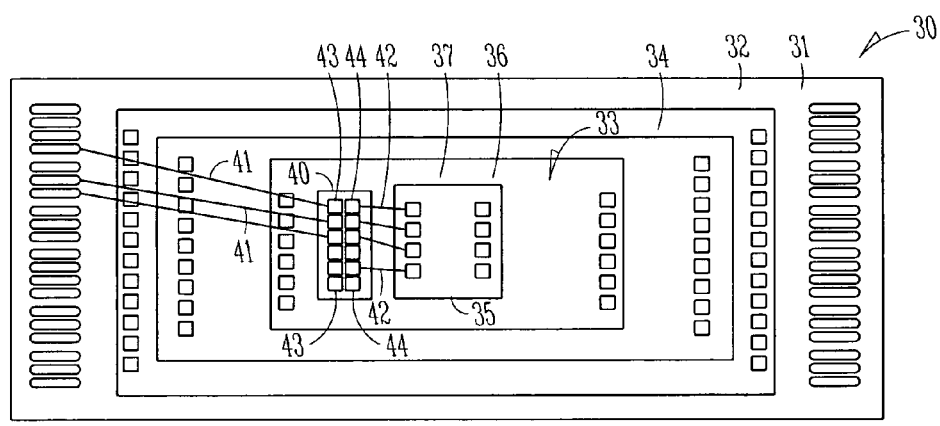
FIG. 13 is a top view illustrating yet another example embodiment of the semiconducting device.

FIG. 13 shows an example embodiment of semiconducting device 30 where interconnect device 40 includes a plurality of pads 43, 44 such that each of the wires 41, 42 may be bonded to one of the pads 43, 44. In some embodiments, the plurality of pads 43, 44 includes multiple pairs of pads that are electrically isolated from each other.

It should be noted that the number, size, shape, arrangement and/or alignment of the pads 43, 44 on each of the interconnect devices 40 will depend in part on the application where the semiconducting device 30 is to be used. As examples, the pads 43, 44 may be arranged linearly or staggered on interconnect device 40.

Figure 14:
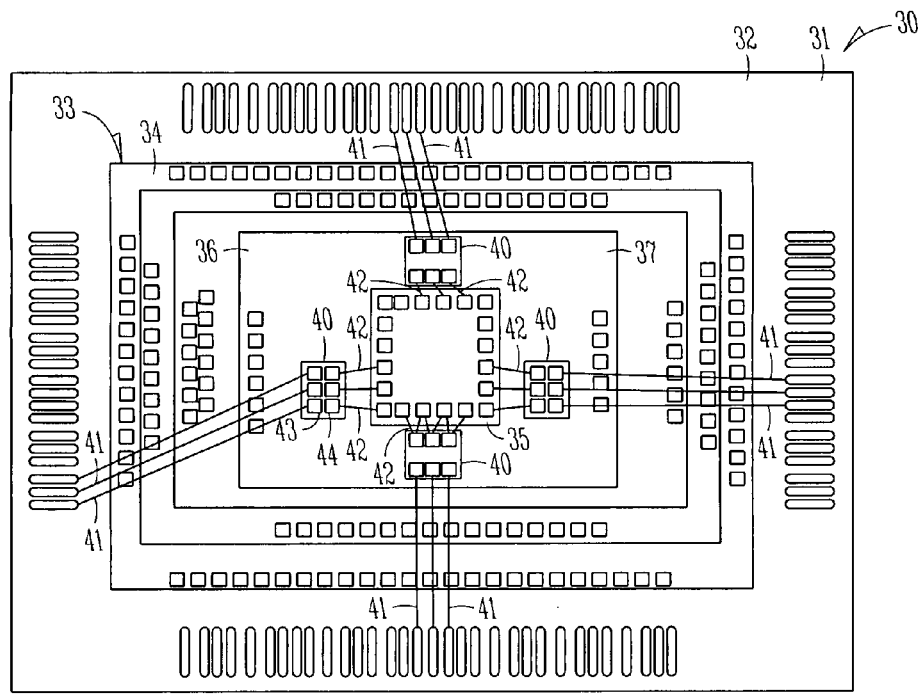
FIG. 14 is a top view illustrating still another example embodiment of the semiconducting device.
Figure 15:
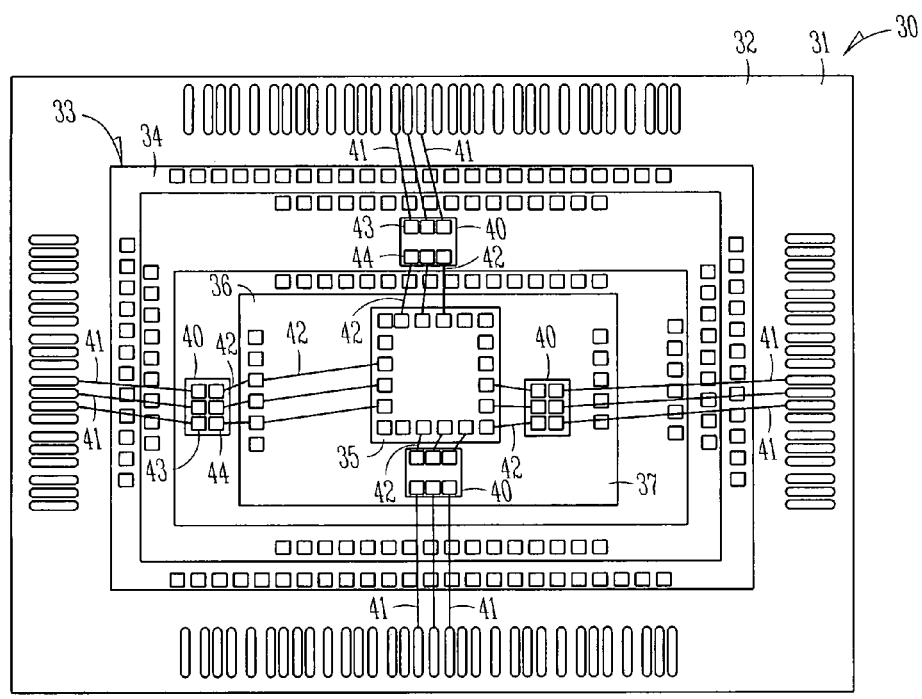
FIG. 15 is a top view illustrating still another example embodiment of the semiconducting device.

In the example embodiments illustrated in FIGS. 14–15, semiconducting device 30 includes a plurality of interconnect devices 40. Each interconnect device 40 is bonded to at least one wire 41 that is also bonded to substrate 31 and at least one other wire 42 that is also bonded to top die 35.

FIG. 14 shows an example embodiment where top die 35 and the plurality of interconnect devices 40 are attached to the upper surface 36 of one die 37 in the stack of dice 33. FIG. 15 shows an example embodiment where the plurality of interconnect devices 40 are attached to the upper surfaces 36, 38, 46 of multiple dice in the stack of dice 33.

In the illustrated example embodiments, interconnect devices 40 are attached to the stack of dice 33 such that there is at least one interconnect device 40 on each side of top die 35. It should be noted that the number, size, shape, arrangement and/or alignment of the interconnect devices 40 will depend in part on the application where the semiconducting device 30 is to be used.

In some embodiments, the dice that form the stack of dice 33 may be concentric with one another to reduce the size of semiconducting device 30. In addition, some of the dice within the stack of dice 33 may include active circuitry (e.g., a flash memory array or logic circuitry) that is exposed on the upper surfaces of the dice. Although four dice are shown stacked on substrate 31 in FIGS. 14–15, any number of dice may be added as part of the embodiments of semiconducting device 30 described herein.

It should be noted that embodiments are contemplated where an interconnect device is used to electrically couple one die in the stack of dice to another die in the stack of dice. As an example, a first wire may be bonded to one die in the stack of dice and the an interconnect device, and a second wire may be bonded to another die in the stack of dice and the interconnect device.

There are also embodiments that are contemplated where interconnect devices are used to couple more than one die in the stack of device to the substrate. As an example, one interconnect device may be used to electrically couple the substrate to the top die in the stack of dice and another interconnect device may be used to couple the substrate to any other die in the stack of dice.

As shown in FIGS. 6 and 8, substrate 31 may include solder balls 48 (or some other type of contact) on a bottom surface 49 of substrate 31. The solder balls 48 allow the substrate 31 to be attached to a motherboard or some other electrical component that may be part of an electronic system. It should be noted that substrate 31 may include any number of conductive or semiconductive traces, paths and/or vias to facilitate transferring signals between the dice in the stack of dice.

Figure 16:
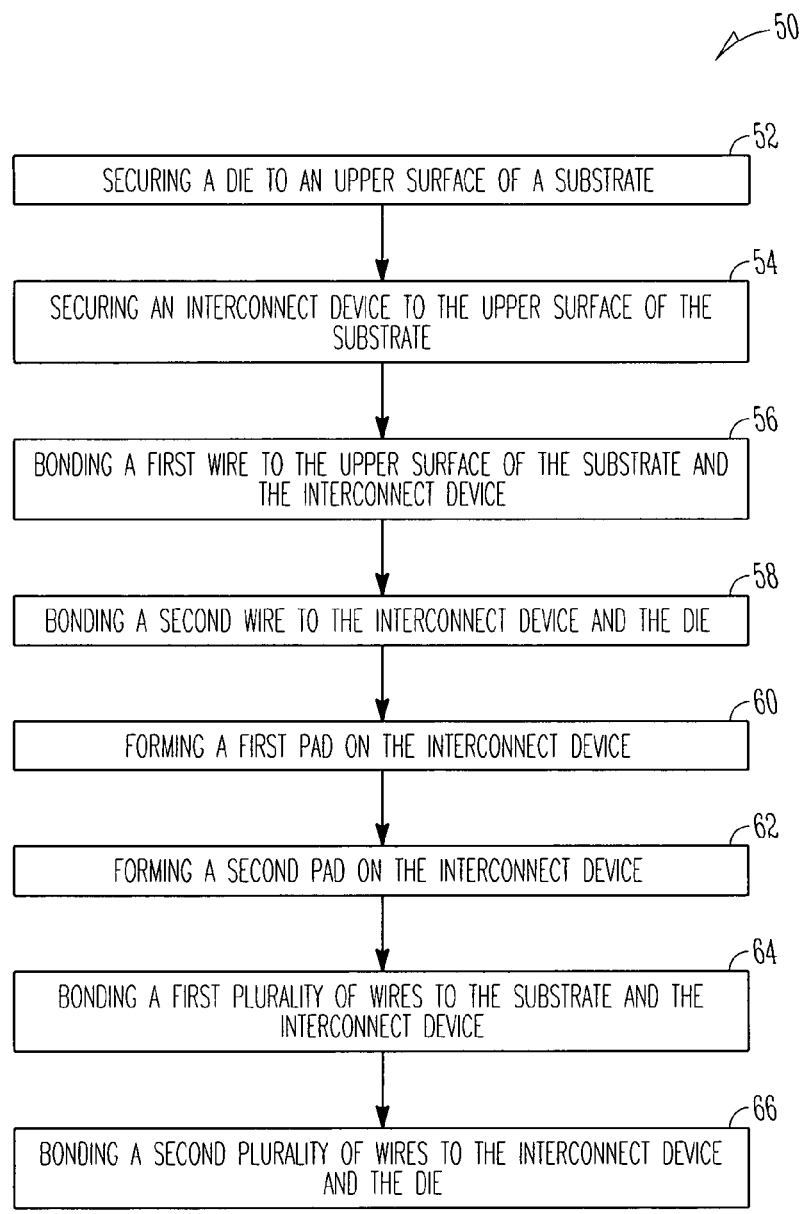
FIG. 16 illustrates a method of fabricating a semiconducting device that includes a die attached to an upper surface of a substrate.

FIG. 16 shows an example method 50 for fabricating electronic devices such as those shown FIGS. 1–7. The method includes 52 securing a die 13 to an upper surface 12 of a substrate 11 and 54 securing an interconnect device 14 to the upper surface 12 of substrate. The method further includes 56 bonding a first wire 15 to substrate 11 and interconnect device 14 and 58 bonding a second wire 16 to interconnect device 14 and die 13.

As used herein, the term "securing" means bonding or attaching. Any securing, or bonding, may occur at any time during the fabrication of the semiconducting device 10. Some of the example methods that may be used to bond interconnect device 14 and die 13 to substrate 11 include soldering, adhesive bonding, thermal bonding and ultrasonic bonding (among others).

In some embodiments, the method 50 may further include 60 forming a first pad 17 on interconnect device 14 such that 56 bonding a first wire 15 to interconnect device 14 includes bonding first wire 15 to first pad 17. The method may further include 62 forming a second pad 18 on interconnect device 14 such that 58 bonding second wire 16 to interconnect device 14 includes bonding second wire 16 to second pad 18. It should be noted that wires 15, 16 may be bonded to pads 17, 18 in any manner.

The method 50 may further include 64 bonding a first plurality of wires 15 to substrate 11 and interconnect device 14 and 66 bonding a second plurality of wires 16 to interconnect device 14 and die 13 (see, e.g., FIGS. 5–7).

It should be noted that die 13 may be secured to substrate 11 in any manner. In addition, interconnect device 14 may be secured to the upper surface 12 of substrate 11 in any manner.

Referring now to FIGS. 8–15 and 17, another example method 70 is described herein. The method 70 includes 72 stacking dice onto an upper surface 32 of a substrate 31 such that a top die 35 is stacked on all other dice in the stack of dice 33. The method further includes 74 securing an interconnect device 40 to an upper surface of any die in the stack of dice 33. The method further includes 76 bonding a first wire 41 to substrate 31 and interconnect device 40 and 78 bonding a second wire 42 to interconnect device 40 and top die 35.

In some embodiments, 74 securing interconnect device 40 to an upper surface of any die in the stack of dice 33 may include securing interconnect device 40 and top die 35 to the upper surface 38 of the same die 37 in the stack of dice 33 (see, e.g., FIGS. 13–14). It should be noted that top die 35 and interconnect device 40 may be secured to the upper surface 36 of die 37 in any manner.

The method 70 may further include 80 securing a plurality of interconnect devices 40 to an upper surface of any die in the stack of dice 33; 82 bonding a first plurality of wires 41 to substrate 31 and the plurality of interconnect devices 40; and 84 bonding a second plurality of wires 42 to the plurality of interconnect devices 40 and top die 35. Wires 41, 42 may be bonded to substrate 31, interconnect devices 40 and top die 35 in any manner.

The method 70 may further include 86 forming a first pad 43 on interconnect device 40 such that 76 bonding a first wire 41 to interconnect device 40 includes bonding first wire 41 to first pad 43; and 88 forming a second pad 44 on interconnect device 40 such that 78 bonding second wire 42 to interconnect device 40 includes bonding second wire 42 to second pad 44.

Figure 18:
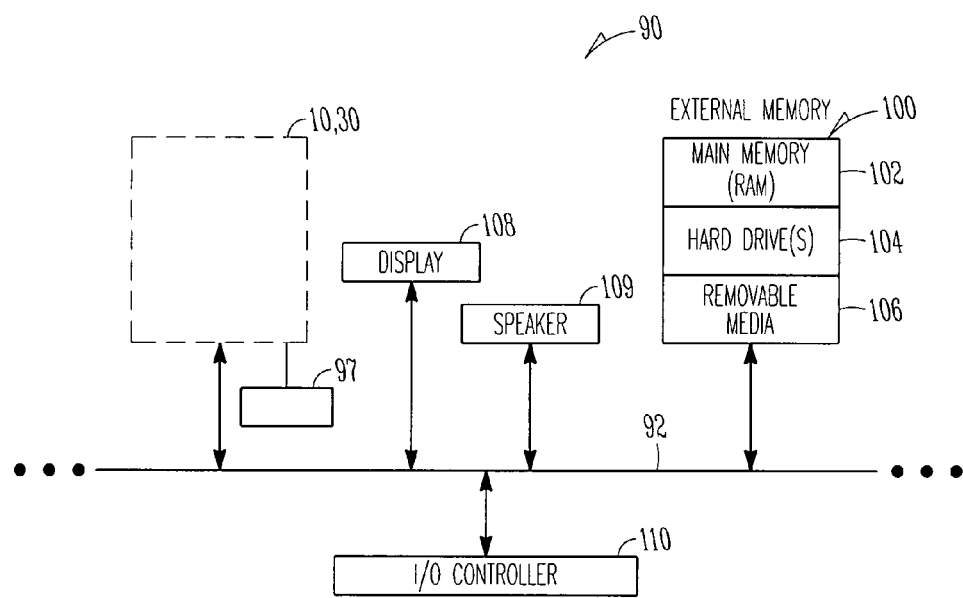
FIG. 18 is a block diagram of an electronic system that incorporates at least one semiconducting device or method of the type shown in FIGS. 1–17.

FIG. 18 is a block diagram of an electronic system 90, such as a computer system, that includes a semiconducting device 10 or 30 which is electrically coupled to various components in electronic system 90 via a system bus 92. Any of the semiconducting devices 10, 30 described or referenced herein may be electrically coupled to system bus 92.

Semiconducting device 10, 30 may include a microprocessor, a microcontroller, a graphics processor or a digital signal processor, memory, flash memory and/or a custom circuit or an application-specific integrated circuit, such as a communications circuit for use in wireless devices such as cellular telephones, pagers, portable computers, two-way radios, and similar electronic systems. System bus 92 may be a single bus or any combination of busses.

The electronic system 90 may also include an external memory 100 that in turn includes one or more memory elements suitable to the particular application, such as a main memory 102 in the form of random access memory (RAM), one or more hard drives 104, and/or one or more drives that handle removable media 106, such as floppy diskettes, compact disks (CDs) and digital video disks (DVDs).

The electronic system 90 may also include a display device 108, a speaker 109, and an I/O controller 110, such as a keyboard, mouse, trackball, game controller, microphone, voice-recognition device, or any other device that inputs information into the electronic system 90.

In some embodiments, electronic system 90 may further include a voltage source 97 that is electrically coupled to the semiconducting device 10, 30. As examples, voltage source 97 may be used to supply power to the die/dice in semiconducting devices 10, 30.

Semiconducting device 10, 30 can be implemented in a number of different embodiments. The elements, materials, geometries, dimensions, and sequence of operations can all be varied to suit particular packaging requirements. Parts of some embodiments may be included in, or substituted for, those of other embodiments.

Figure 17:
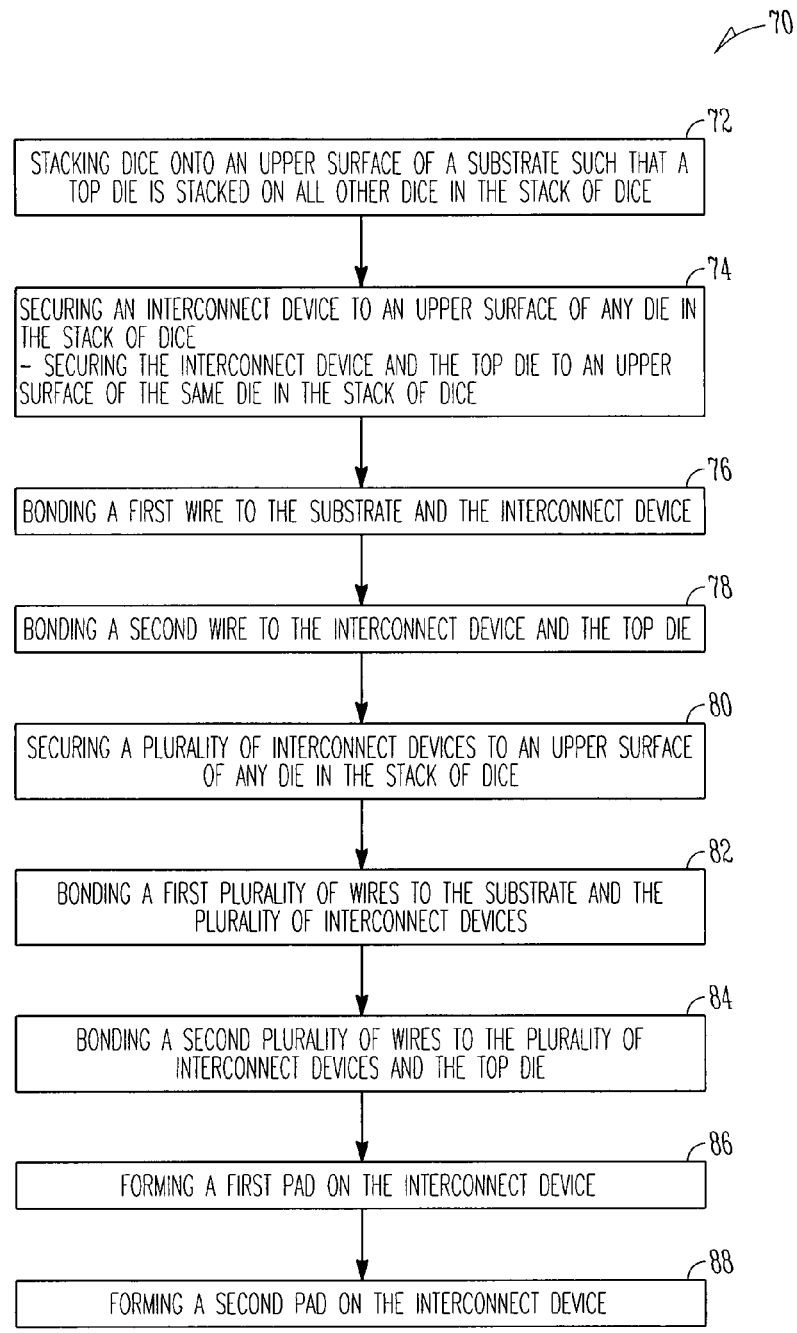
FIG. 17 illustrates a method of fabricating a semiconducting device that includes dice stacked onto an upper surface of a substrate.

As examples, any of the semiconducting devices 10, 30 described herein may be incorporated into any of items referenced in FIGS. 16–18. In addition, the example processes that are described with reference to FIGS. 16 and 17 need not be performed in any particular order.

FIGS. 1–18 are merely representational and are not drawn to scale. Certain proportions thereof may be exaggerated while others may be reduced. Many other embodiments will be apparent to those of skill in the art.

What is claimed is:

1. A semiconducting device comprising:
    a substrate having an upper surface;
    a first die attached to the upper surface of the substrate;
    an interconnect device attached to the upper surface of the substrate;
    a first wire bonded to the upper surface of the substrate and to the interconnect device; and
    a second wire bonded to the interconnect device and to the first die, wherein the interconnect device includes a first pad and a second pad that is electrically connected to the first pad, the first wire being bonded to the first pad and the second wire being bonded to the second pad.

2. The semiconducting device of claim 1, wherein the interconnect device includes a silicon wafer such that the first pad and the second pad are formed as part of the silicon wafer.

3. A semiconducting device comprising:
    a substrate having an upper surface;

a first die attached to the upper surface of the substrate;

an interconnect device attached to the upper surface of the substrate;

a first wire bonded to the upper surface of the substrate and to the interconnect device;

a second wire bonded to the interconnect device and to the first die; and a plurality of wires where some of the wires are bonded to the upper surface of the substrate and to the interconnect device and others of the wires are bonded to the interconnect device and to the first die.

4. The semiconducting device of claim 3, wherein the interconnect device includes a plurality of pads such that each of the wires is bonded to one of the pads.

5. The semiconducting device of claim 4, wherein each of the wires is bonded to a separate pad.

6. The semiconducting device of claim 4, wherein the plurality of pads includes multiple pairs of pads that are electrically isolated from each other.

7. The semiconducting device of claim 3, further comprising a plurality of interconnect devices where each interconnect device is bonded to one wire that is also bonded to the substrate and another wire that is also bonded to the first die.

8. The semiconducting device of claim 7, wherein there are interconnect devices attached to the upper surface of the substrate on multiple sides of the first die.

9. A semiconducting device comprising:

a substrate having an upper surface;

a stack of dice, the stack of dice including a bottom die that is attached to the upper surface of the substrate and a top die that is stacked onto the other dice in the stack of dice;

an interconnect device attached to an upper surface of any die in the stack of dice;

a first wire bonded to the upper surface of the substrate and to the interconnect device; and a second wire bonded to the interconnect device and to the top die.

10. The semiconducting device of claim 9, wherein the top die is attached to an upper surface of one die in the stack of dice and the interconnect device is attached to an upper surface of a different die in the stack of dice.

11. The semiconducting device of claim 9, wherein the top die and the interconnect device are attached to an upper surface of the same die in the stack of dice.

12. The semiconducting device of claim 9, wherein the second wire is bonded to the interconnect device and to the top die.

13. The semiconducting device of claim 9, wherein the interconnect device includes a silicon wafer such that the first pad and the second pad are part of the silicon wafer.

14. The semiconducting device of claim 9, further comprising a plurality of wires where some of the wires are bonded to the upper surface of the substrate and to the interconnect device and others of the wires are bonded to the interconnect device and to the top die.

15. The semiconducting device of claim 14, wherein the interconnect device includes a plurality of pads such that each of the wires is bonded to one of the pads, the plurality of pads including multiple pairs of pads that are electrically isolated from each other.

16. The semiconducting device of claim 14, further comprising a plurality of interconnect devices where each interconnect device is bonded to one wire that is also bonded to the substrate and another wire that is also bonded to the top die.

17. The semiconducting device of claim 16, wherein the plurality of interconnect devices are attached to the upper surface of any die in the stack of dice.

18. The semiconducting device of claim 16, wherein the top die and the plurality of interconnect devices are attached to the upper surface of the same die in the stack of dice.

19. The semiconducting device of claim 16, wherein the plurality of interconnect devices are attached to an upper surface of any die in the stack of dice such that there is at least one interconnect device on each side of the top die.

20. An electronic system comprising:

a bus;

an I/O controller coupled to the bus; and a semiconducting device coupled to the bus, the semiconducting device including a substrate, a first die and an interconnect device, the first die and the interconnect device each being attached to an upper surface of the substrate, the semiconducting device further including a first wire bonded to the substrate and the interconnect device and a second wire bonded to the interconnect device and the first die.

21. The electronic system of claim 20, wherein the semiconducting device further includes a stack of dice such that the first die is a top die in the stack of dice and the interconnect device is attached to an upper surface of any die in the stack of dice.

22. The electronic system of claim 20, further comprising a voltage source coupled to the semiconducting device.

* * * * *